(12) United States Patent
Chang et al.

(10) Patent No.: US 7,817,228 B2
(45) Date of Patent: Oct. 19, 2010

(54) MANUFACTURING METHOD OF AN LCD COMPRISING A MOLD AND A MASK

(75) Inventors: Jae-hyuk Chang, Seoul (KR); Mun-pyo Hong, Seongnam-si (KR); Nam-seok Roh, Seongnam-si (KR); Dae-jin Park, Incheon (KR)

(73) Assignee: Samsung Electronics Co., Ltd. (KR)

( * ) Notice: Subject to any disclaimer, the term of this patent is extended or adjusted under 35 U.S.C. 154(b) by 116 days.

(21) Appl. No.: 11/397,972

(22) Filed: Apr. 5, 2006

(65) Prior Publication Data

US 2006/0281204 A1 Dec. 14, 2006

(30) Foreign Application Priority Data

Jun. 13, 2005 (KR) ........................ 10-2005-0050438

(51) Int. Cl.
*G02F 1/1335* (2006.01)
*G02F 1/13* (2006.01)

(52) U.S. Cl. ........................ 349/113; 349/114; 349/187

(58) Field of Classification Search ................... 349/43, 349/113–114, 187; 313/495
See application file for complete search history.

(56) References Cited

U.S. PATENT DOCUMENTS

| | | | | |
|---|---|---|---|---|
| 6,452,653 | B1 * | 9/2002 | Yamanaka et al. | 349/113 |
| 2003/0156240 | A1 * | 8/2003 | Oda et al. | 349/113 |
| 2003/0219992 | A1 | 11/2003 | Schaper | 438/748 |
| 2004/0134878 | A1 | 7/2004 | Matsushita et al. | |
| 2004/0227877 | A1 * | 11/2004 | Jeong et al. | 349/114 |
| 2004/0233359 | A1 * | 11/2004 | Nam et al. | 349/114 |
| 2004/0245914 | A1 * | 12/2004 | Takenaka et al. | 313/495 |
| 2005/0099575 | A1 * | 5/2005 | Liang | 349/153 |
| 2005/0253978 | A1 * | 11/2005 | Chae et al. | 349/43 |
| 2006/0197892 | A1 * | 9/2006 | Fujiwara et al. | 349/113 |

FOREIGN PATENT DOCUMENTS

| | | |
|---|---|---|
| CN | 1191327 | 8/1998 |
| CN | 1591047 | 3/2005 |
| JP | 10260413 | 9/1998 |
| JP | 2001260219 | 9/2001 |
| JP | 2002055359 | 2/2002 |
| JP | 2002268057 | 9/2002 |
| JP | 2003322712 | 11/2003 |
| JP | 2004111933 | 4/2004 |
| KR | 10-2004-0084325 | 10/2004 |
| KR | 10-2005-0010343 | 1/2005 |
| TW | 230310 | 4/2005 |

\* cited by examiner

*Primary Examiner*—Andrew Schechter
*Assistant Examiner*—Charles Chang
(74) *Attorney, Agent, or Firm*—Cantor Colburn LLP

(57) ABSTRACT

A manufacturing method of an LCD comprises forming an insulating substrate; forming a gate line extending in a horizontal direction and a data line insulatively crossing the gate line to define a pixel area on the insulating substrate; forming a TFT disposed at an intersection of the gate line and the data line and comprising a drain electrode; forming an organic passivation layer on the TFT; forming a drain contact hole exposing the drain electrode and forming an embossing pattern in the organic passivation layer by disposing and pressurizing a mold having an intaglio pattern corresponding to the pixel area and a projection corresponding to the drain electrode on the organic passivation layer; and forming a pixel electrode connected to the drain electrode through the drain contact hole.

4 Claims, 13 Drawing Sheets

MANUFACTURING METHOD OF AN LCD COMPRISING A MOLD AND A MASK

This application claims priority to Korean Patent Application No. 2005-0050438, filed on Jun. 13, 2005, and all the benefits accruing therefrom under 35 U.S.C. §119, and the contents of which in its entirety are herein incorporated by reference.

BACKGROUND OF THE INVENTION

1. Field of the Invention

The present invention relates to a manufacturing method of a liquid crystal display, and more particularly, to a manufacturing method of a transflective liquid crystal display.

2. Description of the Related Art

A liquid crystal display ("LCD") comprises an LCD panel having a thin film transistor ("TFT") substrate on which TFTs are formed, a color filter substrate on which color filters are formed and liquid crystal injected between the two substrates. Since the LCD panel does not emit light by itself, the LCD may comprise a backlight unit disposed in a rear of the TFT substrate for providing light to the LCD panel. A transmittance of light from the LCD panel is controlled depending on an arrangement of liquid crystal.

The LCD may either be a transmissive type or a reflective type, depending on a type of a light source. Conventionally, the transmissive type is generally used. The transmissive type includes the backlight unit disposed in the rear of the LCD panel and transmits light from the backlight unit through the LCD panel. However, the transmissive type consumes a lot of electric power and has disadvantages of being heavy and thick. An LCD consuming less electric power, as well as being lightweight and slim, has been developed in order to solve the above noted disadvantages for use as a portable communications apparatus. Thereamong, a reflective LCD has been recognized to consume less electric power while being lightweight and slim. The reflective LCD may consume less electric power by limiting use of the backlight unit which accounts for about 70% of the total electric power consumption in the transmissive LCD by using natural light instead in the reflective LCD.

Meanwhile, a transflective LCD, which has advantages of both the transmissive type and the reflective type, may obtain adequate brightness for the desired purpose regardless of a change in brightness of a surrounding natural light by using both the natural light and the backlight unit.

When the aforementioned TFT substrate of the transflective LCD is manufactured, an insulating substrate used for the TFT substrate is entirely coated with an organic passivation layer and embossing patterns are formed thereon using a slit mask on the organic passivation layer.

However, the embossing patterns formed using the slit mask do not provide a good yield and reflectance. In addition, forming the embossing patterns using a slit mask involves a complex manufacturing process.

BRIEF SUMMARY OF THE INVENTION

The present invention provides a manufacturing method of a liquid crystal display which improves yield and reflectance of embossing patterns and simplifies a process of forming the embossing patterns.

The foregoing and/or other aspects of the present invention are achieved by providing a manufacturing method of an LCD. According to an exemplary embodiment of the present invention, the method comprises forming an insulating substrate; forming a gate line extending in a horizontal direction and a data line insulatively crossing the gate line to define a pixel area on the insulating substrate; forming a TFT disposed at an intersection of the gate line and the data line and comprising a drain electrode; forming an organic passivation layer on the TFT; forming a drain contact hole exposing the drain electrode; forming an embossing pattern in the organic passivation layer by disposing and pressurizing a mold having an intaglio pattern corresponding to the pixel area and a projection corresponding to the drain electrode on the organic passivation layer; and forming a pixel electrode connected to the drain electrode through the drain contact hole.

An end portion of the projection contacts the drain electrode when the mold is pressurized.

The manufacturing method of the LCD further comprises forming a reflective layer on at least one area of the pixel electrode.

The organic passivation layer is formed of a high cohesive organic material.

The manufacturing method of the LCD further comprises removing the mold and removing the organic passivation layer where an embossing pattern is not formed by disposing a mask on the organic passivation layer and exposing and developing the organic passivation layer.

The mask has a hole corresponding to the pixel area.

The organic passivation layer is formed of a low cohesive organic material.

Forming the embossing pattern and the drain contact hole includes using a mask unified with the mold and having a hole corresponding to the pixel area.

The manufacturing method of the LCD further comprises exposing and hardening the organic passivation layer by using the mold and the mask, which are unified.

The manufacturing method of the LCD further comprises removing the mold and the mask, which are unified, and removing the organic passivation layer where the embossing pattern is not formed by developing the organic passivation layer.

The mold is formed of a transparent material transmitting ultraviolet rays.

The mold is formed of PDMS (polydimethylsilixane).

A distance between the lower side of the mask contacting the mold and the top of the intaglio pattern is in the range of about 0.1 mm to about 0.7 mm.

A release agent is applied on the surface of the mold where the intaglio pattern is formed.

BRIEF DESCRIPTION OF THE DRAWINGS

The accompanying drawings, which are included to provide a further understanding of the invention and are incorporated in and constitute a part of this specification, illustrate exemplary embodiments of the present invention and together with the detailed description serve to explain the principles of the present invention.

DETAILED DESCRIPTION OF THE INVENTION

Figure 1:
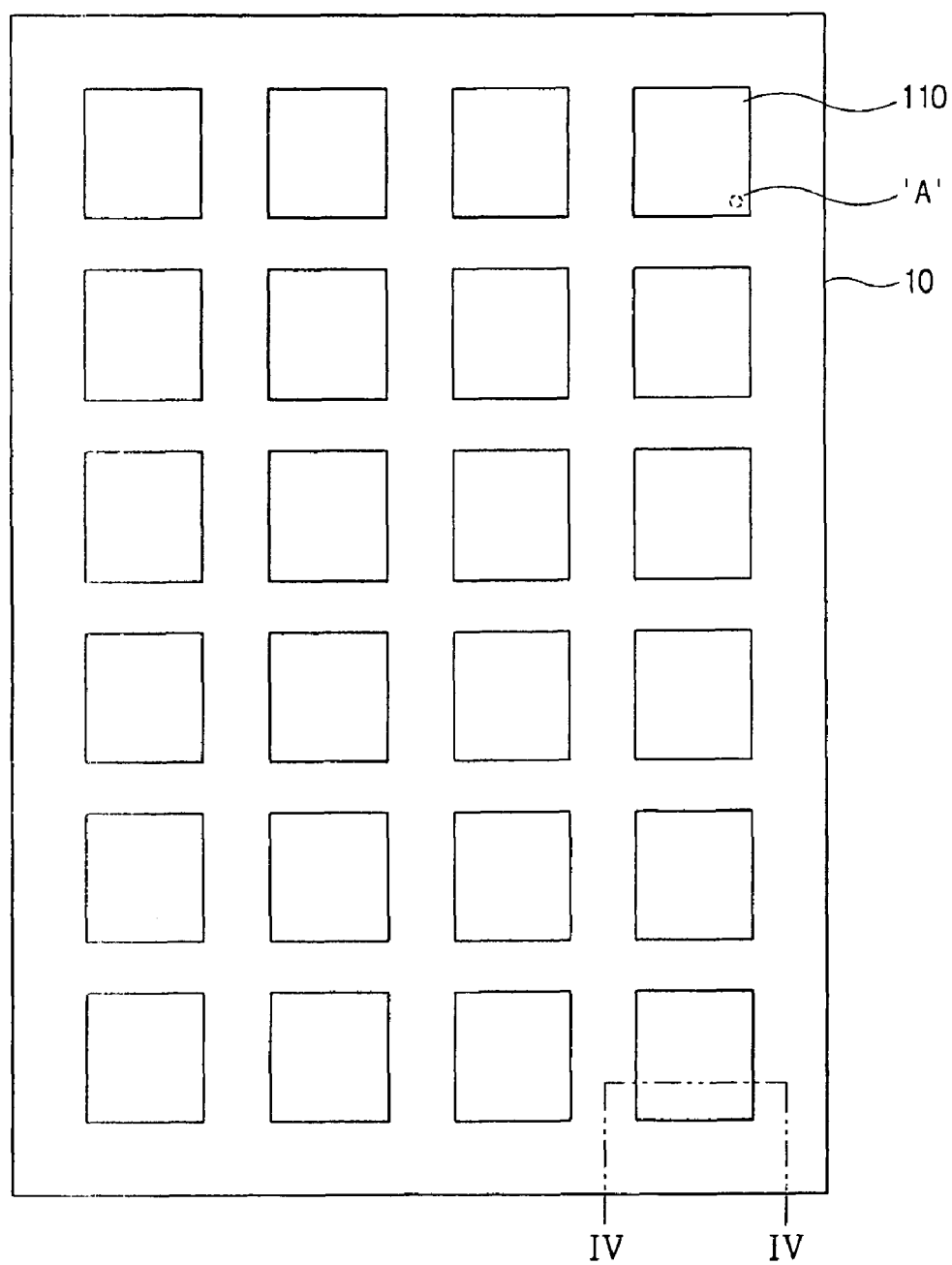
FIG. 1 is a plan view of an exemplary embodiment of a TFT substrate according to the present invention.

The exemplary embodiments of the present invention will now be described with reference to the attached drawings. The present invention may, however, be embodied in different forms and thus the present invention should not be construed as being limited to the exemplary embodiments set forth herein. Rather, these exemplary embodiments are provided so that this disclosure will be thorough and complete, and will fully convey the scope of the invention to those skilled in the art.

In the drawings, the thickness of the layers, films, and regions are exaggerated for clarity. When an element such as a layer, film, region, or substrate is referred to as being "on" another element, it can be directly on the other element or intervening elements may also be present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An LCD panel 1 according to an exemplary embodiment of the present invention comprises a TFT substrate 100 (a first substrate), a color filter substrate 200 (a second substrate) opposite thereto and a liquid crystal layer 300 interposed between the first and second substrates.

First, the TFT substrate 100 will be described as follows.

A plurality of first insulating substrates 110 in FIG. 1 are manufactured from a substrate 10. A resultant TFT substrate 100 is processed by passing each of the first insulating substrates 110 through a series of manufacturing processes. Here, an organic passivation layer formed between each of the insulating substrates 110 is removed in processes of exposure and development.

Figure 2:
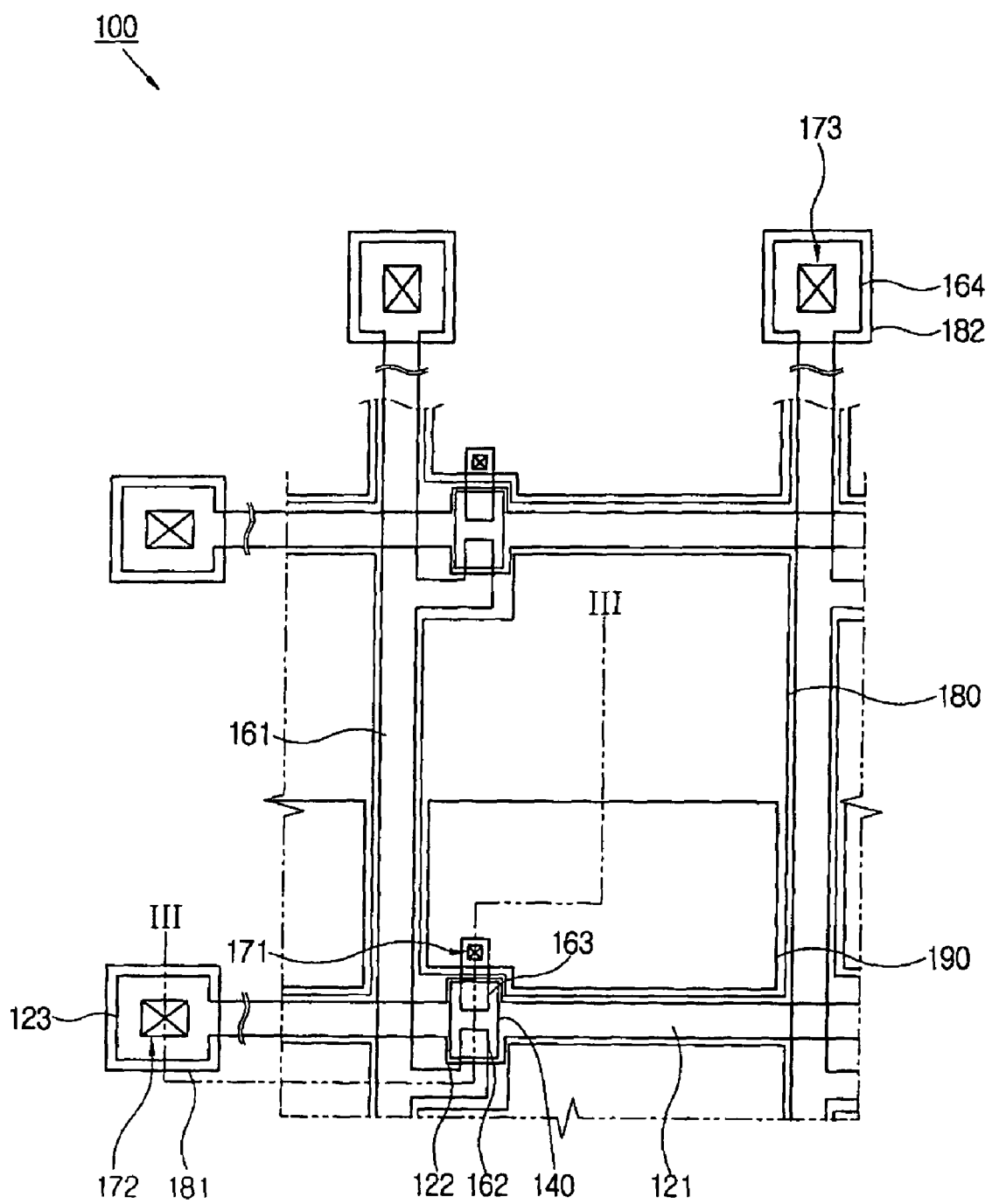
FIG. 2 is an enlarged plan view illustrating an arrangement of an area 'A' in FIG. 1.

As shown in FIG. 2, which is an enlarged view of 'A' in FIG. 1, a gate line assembly 121, 122, 123 is formed on the first insulating substrate 110. The gate line assembly 121, 122, 123 may be either a single-layer or a multi-layer metal. The gate line assembly 121, 122, 123 comprises a gate line 121 formed in a horizontal direction (as illustrated in FIG. 2), a gate electrode 122 connected to the gate line 121 and a gate pad 123 connected to a gate driving part (not shown) to be applied with a driving signal.

Figure 3:
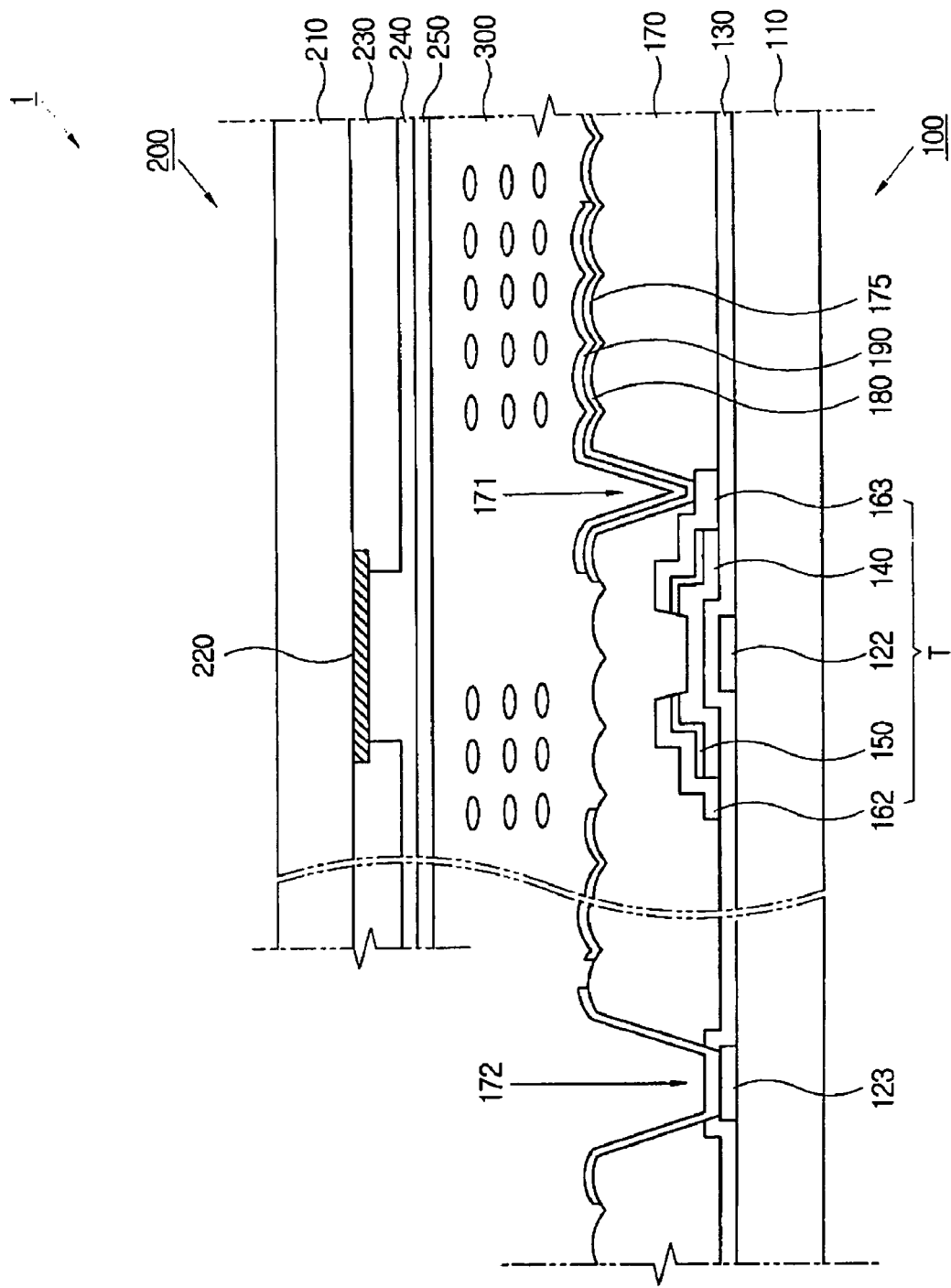
FIG. 3 is a cross-sectional view, taken along line III-III in FIG. 2.

As seen with reference to FIG. 3, a gate insulating layer 130, formed of silicon nitride (SiNx) or the like, is formed on the first insulating substrate 110. The gate insulating layer 130 covers the gate line assembly 121, 122, 123.

A semiconductor layer 140, formed of amorphous silicon or the like, is formed on the gate insulating layer 130 of the gate electrode 122. An ohmic contact layer 150, formed of n+hydrogenated amorphous silicon, which is highly-doped with silicide or n-type impurities, is formed on the semiconductor layer 140. The ohmic contact layer 150 is removed on a channel between a source electrode 162 and a drain electrode 163.

A data line assembly 161, 162, 163 is formed on the ohmic contact layer 150 and the gate insulating layer 130. The data line assembly 161, 162, 163 may be either a single-layer or a multi-layer formed of metal as well. The data line assembly 161, 162, 163 comprises a data line 161 formed in a vertical direction (as illustrated in FIG. 2) and crossing the gate line 121 to define a pixel area, a source electrode 162 branching from the data line 161 and extending over the ohmic contact layer 150, and a drain electrode 163 separated from the source electrode 162. The drain electrode 163 is formed over the ohmic contact layer 150 while being opposite to the source electrode 162 across the gate electrode 122.

An organic passivation layer 170 is formed on the data line assembly 161, 162, 163 and a portion of the semiconductor layer 140, which is not covered with the data line assembly 161, 162, 163. An embossing pattern 175, a drain contact hole 171 exposing the drain electrode 163, and a gate pad contact hole 172 and a data pad contact hole 173 are all formed on the organic passivation layer 170. The gate pad contact hole 172 and the data pad contact hole 173 connect the gate driving part (not shown) and the data driving part (not shown) so as to apply the driving signal to the gate line 121 and the data line 161. The embossing pattern 175 formed on the organic passivation layer 170 enhances reflectance by inducing light incident thereto to be diffused. Here, an inorganic insulating layer formed of silicon nitride or the like is further formed between the protective layer 170 and the TFT (T) (FIG. 3) in order to ensure that the TFT operates well. The organic passivation layer 170 may be a high cohesive organic layer so as to keep a predetermined shape, or a low cohesive organic layer so as not to keep a predetermined shape, but to be hardened by ultraviolet rays or heat.

A pixel electrode 180 is formed on the protective layer 170 where the embossing pattern 175 is formed. The pixel electrode 180 is electrically connected to the drain electrode 163 through the drain contact hole 171. Also, the embossing pattern 175 formed on the protective layer 170 is formed on the pixel electrode 180. Further, contact subsidiary parts 181, 182 (FIG. 2) are formed on the gate pad contact hole 172 and the data pad contact hole 173, respectively. The pixel electrode 180 and the contact subsidiary parts 181, 182 are usually formed of ITO (indium tin oxide) or IZO (indium zinc oxide).

A reflective layer 190 is formed on the pixel electrode 180. Here, the pixel area formed by the gate line 121 and the data line 161 is divided into a transmitting area on which the reflective layer 190 is not formed and a reflecting area on which the reflective layer 190 is formed. Light from a backlight unit (not shown) passes through and radiates external to an LCD panel 1 in the transmitting area where the reflective layer 190 is not formed, and light external to the LCD panel 1 is reflected from the reflecting area where the reflective layer 190 is formed and radiates external to the LCD panel 1. The reflective layer 190 is usually formed of aluminum and silver and may be formed of an aluminum/molybdenum double-layer as well. The reflective layer 190 is electrically connected to the drain electrode 163 through the drain contact hole 171. Further, an embossing pattern on the pixel electrode 180 is also formed on the reflective layer 190.

Next, the color filter substrate 200 will be described as follows.

A black matrix 220 is formed on a second insulating substrate 210. The black matrix 220 generally divides red green and blue filter from each other and intercepts direct light radiation to the TFT (T) on the first insulating substrate 110. The black matrix 220 is usually formed of a photoresist organic material to which a black pigment is added, wherein the black pigment is carbon black, titanium oxide, or the like.

A red filter, a green filter and a blue filter are repeatedly formed on a color filter 230 on the boundary of the black matrix 220. The color filter 230 invests light radiated from the backlight unit and passing through the liquid crystal layer 300 with color. The color filter 230 is usually formed of a photoresist organic material.

An overcoat layer 240 is formed on the color filter 230 and the black matrix 220 which is not covered with the color filter 230. The overcoat layer 240 flattens and protects the color filter 230 and is usually formed of acryl epoxy.

A common electrode 250 is formed on the overcoat layer 240. The common electrode 250 is formed of ITO or IZO. The common electrode 250 directly applies a voltage to the liquid crystal layer 300 along with the pixel electrode 180 of the TFT substrate 100.

Subsequently, the liquid crystal layer 300 is injected between the TFT substrate 100 and the color filter substrate 200, and the two substrates 100, 200 adhere to each other by a sealant (not shown), then the LCD panel 1 is finished.

Hereinafter, a manufacturing method of a TFT substrate according to an exemplary embodiment of the present invention will be described. FIGS. 4a through 4f are cross-sectional views, taken along line IV-IV of FIG. 1, illustrating a method of forming an embossing pattern 175 on an organic passivation layer 170 of a first substrate 100.

With reference to FIGS. 2 and 3, gate line substance is deposited on the first insulating substrate 110 and then patterned by performing a photolithography process to form the gate line assembly 121, 122, 123. The gate line assembly 121, 122, 123 comprises the gate line 121, the gate electrode 122 and the gate pad 123. Then, the gate insulating layer 130, the semiconductor layer 140 and the ohmic contact layer 150 are sequentially deposited on the first insulating substrate 110.

The semiconductor layer 140 and the ohmic contact layer 150 are patterned by performing a photolithography process, thereby forming the semiconductor layer 140 on the gate insulating layer 130 over the gate electrode 122. The ohmic contact layer 150 is formed over the semiconductor layer 140.

Thereafter, data line substance is deposited thereon and then patterned by a photolithography process to form the data line assembly 161, 162, 163. The data line assembly 161, 162, 163 comprises the data line 161 crossing the gate line 121, the source electrode 162 connected to the data line 161 and extending over the gate electrode 122, and the drain electrode 163 opposite to the source electrode 162. Subsequently, the ohmic contact layer 150 is etched where the data line assembly 161, 162, 163 is not deposited, thereby being separated with respect to the gate electrode 122 and exposing the semiconductor layer 140 between the ohmic contact layers 150. In this process, the ohmic contact layer 150 is removed for the most part, and the semiconductor layer 140 may be partly etched. Additionally, an oxygen plasma pulse can be applied to stabilize the surface of the exposed semiconductor layer 140.

Figure 4A:
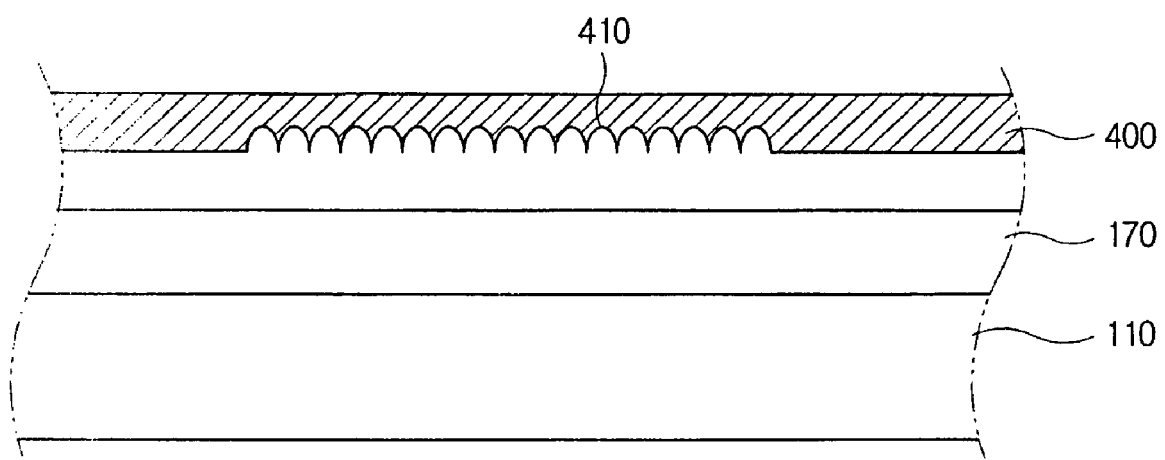
FIGS. 4A through 4F are cross-sectional views illustrating a manufacturing process of a TFT substrate, taken along line IV-IV in FIG. 1.
Figure 4B:
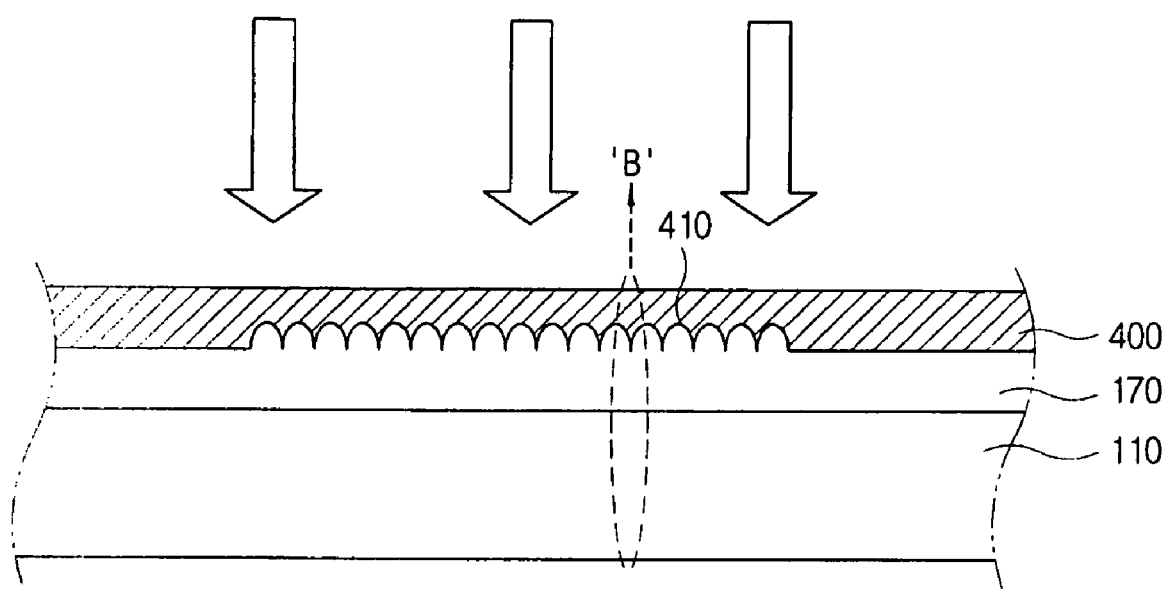
Figure 4C:
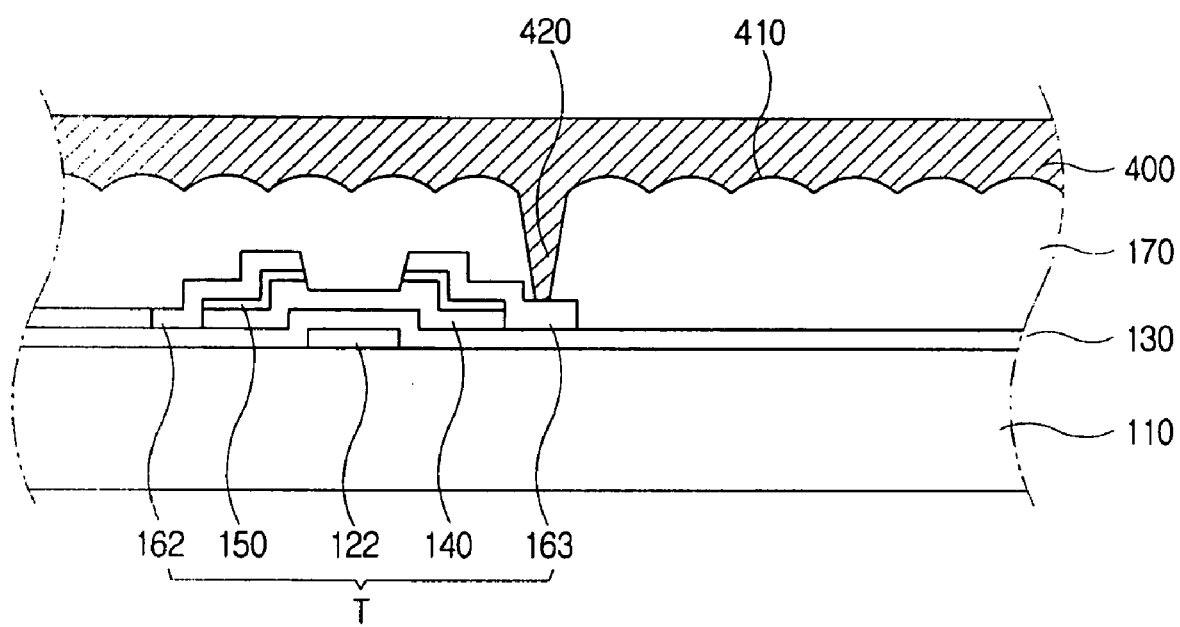
Figure 4D:
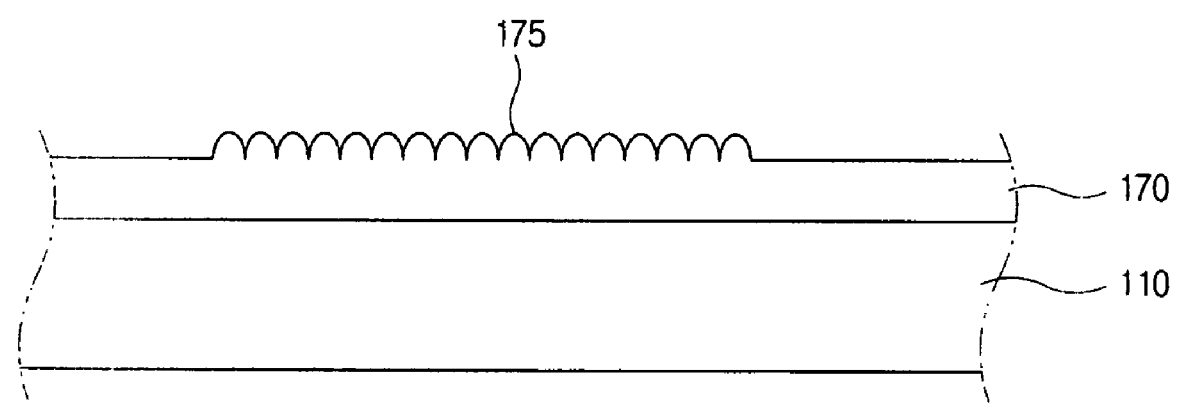
Figure 4E:
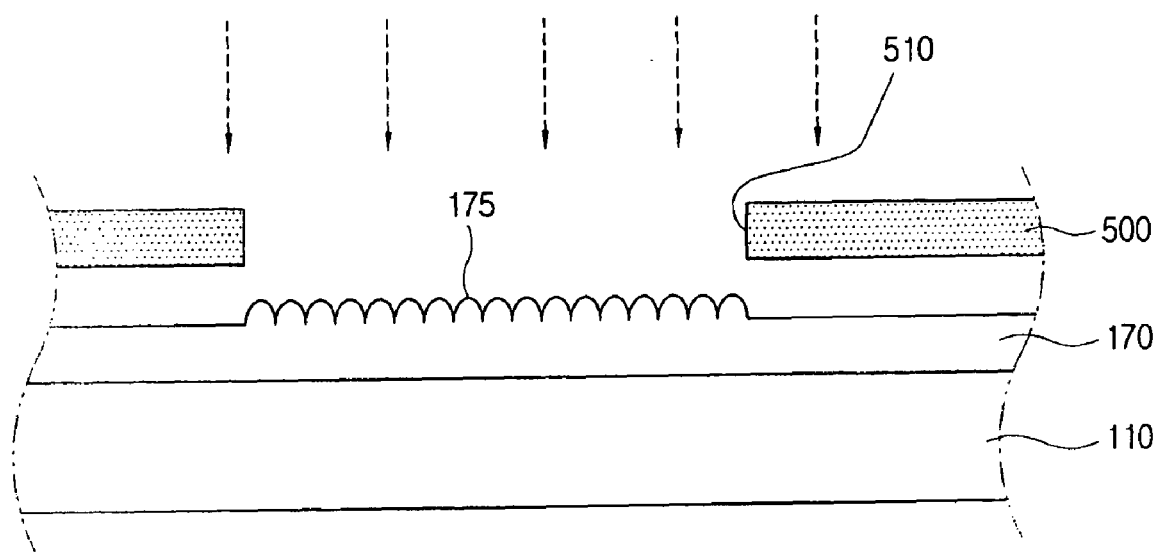

Then, the organic passivation layer 170 is formed thereon by performing a spin coating or a slit coating. The organic passivation layer 170 is an organic polymer. As shown in FIG. 4A, a mold 400 having an intaglio pattern 410 is disposed on an area corresponding to the pixel area on the organic passivation layer 170. Thereafter and referring to FIG. 4B, the mold 400 is pressurized in the direction of the organic passivation layer 170, thereby forming an embossing pattern 175 on the surface of the organic passivation layer 170. Referring to FIG. 4C showing an enlarged view of 'B' in FIG. 4B, the mold 400 comprises a projection 420, which is disposed on an area corresponding to the drain electrode 163. Meanwhile, the drain contact hole 171 exposing the drain electrode 163 is formed by the projection 420 when the mold 400 is pressurized. Here, the projection 420 can be as long as needed to be in contact with the drain electrode 163 when the mold 400 is pressurized. Further, a cross section of the projection 420 forms a trapezoid shape so as to make a hole through the organic passivation layer 170 and form the drain contact hole 171 connecting the drain electrode 163 and the pixel electrode 180 (mentioned later).

In this case, an inorganic insulating layer formed of silicon nitride or the like is further formed between the protective passivation layer 170 and the TFT (T) in order to ensure that the TFT operates well.

Figure 4F:
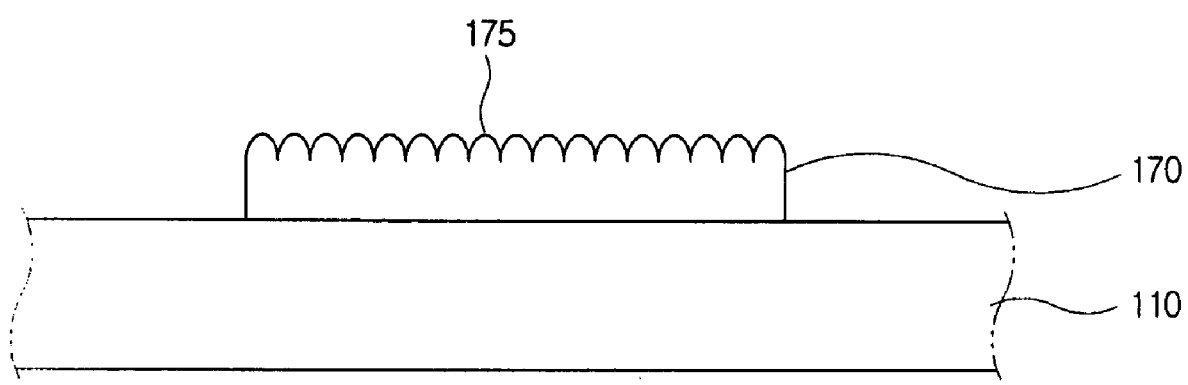

When the organic passivation layer 170 is a high cohesive organic layer, the drain contact hole 171 may not be formed properly. In this case referring to FIG. 4D, the mold 400 is removed from the protective organic passivation layer 170. Thereafter referring to FIG. 4E, a mask 500 having a hole 510 is disposed to expose the embossing pattern 175, and then an exposure process is performed, which irradiates ultraviolet rays. Then, as shown in FIG. 4F, a development process is performed to remove the organic passivation layer 170 where the embossing pattern 175 is not formed. By the development process, the organic passivation layer 170, not only disposed between the insulating substrates 110 but left inside the drain contact hole 171 when the drain contact hole 171 is formed, is removed, thereby forming a superior drain contact hole 171. Although not shown in drawings, the gate pad contact hole 172 and the data pad contact hole 173 may be formed by the same method as the drain contact hole 171.

In this exemplary embodiment, the organic passivation layer 170 having the embossing pattern 175 is formed of a photoresist organic material of which an area exposed to ultraviolet rays is removed. However, the organic passivation layer 170 having the embossing pattern 175 may be formed of a photoresist organic material of which an area not exposed to ultraviolet rays is removed. In this case, the hole 510 is disposed on an area of the mask 500 corresponding to the organic passivation layer 170 which is not removed.

Referring to FIG. 3, the ITO or the IZO is deposited on the organic passivation layer 170 and etched by performing a photolithography process, thereby forming the pixel electrode 180 electrically connected to the drain electrode 163 through the drain contact hole 171. The pixel electrode 180 is formed the embossing pattern 175. Further, contact subsidiary parts 181, 182 are formed to be connected to the gate pad 123 and the data pad 164 through the gate pad contact hole 172 and the data pad contact hole 173, respectively.

Then, a reflective material is deposited on the pixel electrode 180 and patterned, thereby forming the reflective layer 190 on at least one area of the pixel electrode 180. The reflective layer 190 may be formed of silver, chrome or compound of the same, or may be formed of an aluminum or an aluminum/molybdenum double-layer, as well. The reflective layer 190 is formed on the reflecting area except the transmitting area. The reflective layer 190 has an embossing pattern, as well, formed by the aforementioned embossing pattern 175. The reflective layer 190 is connected to the drain electrode 163 through the drain contact hole 171 and is applied with an electrical signal. The electrical signal is applied to the liquid crystal layer 300 disposed over the reflective layer 190.

Thereafter, an alignment film (not shown) is formed, then providing the TFT substrate 100 according to the first described exemplary embodiment of the present invention.

Further, the black matrix 220, the color filter 230, the overcoat layer 240, the common electrode 250 and the alignment film are formed on the second insulating substrate 210 by the conventional art, thereby finishing the second substrate 200. Then, the first substrate 100 and the second substrate 200 adhere to each other and liquid crystals are interposed therebetween to finish the LCD panel 1.

According to the aforementioned method, the embossing pattern 175 is provided simply by the mold 400 without using a slit mask, thereby enhancing yield and reflectance of the embossing pattern 175 and simplifying the manufacturing process. As the drain contact hole 171 is formed by the projection 420 on the mold 400, and then the exposure and the development processes are performed to remove an organic material in the drain contact hole, the superior drain contact hole 171 is especially made superior.

Hereinafter, another exemplary embodiment according to the present invention will be described referring to FIGS. 5A through 5D.

Figure 5A:
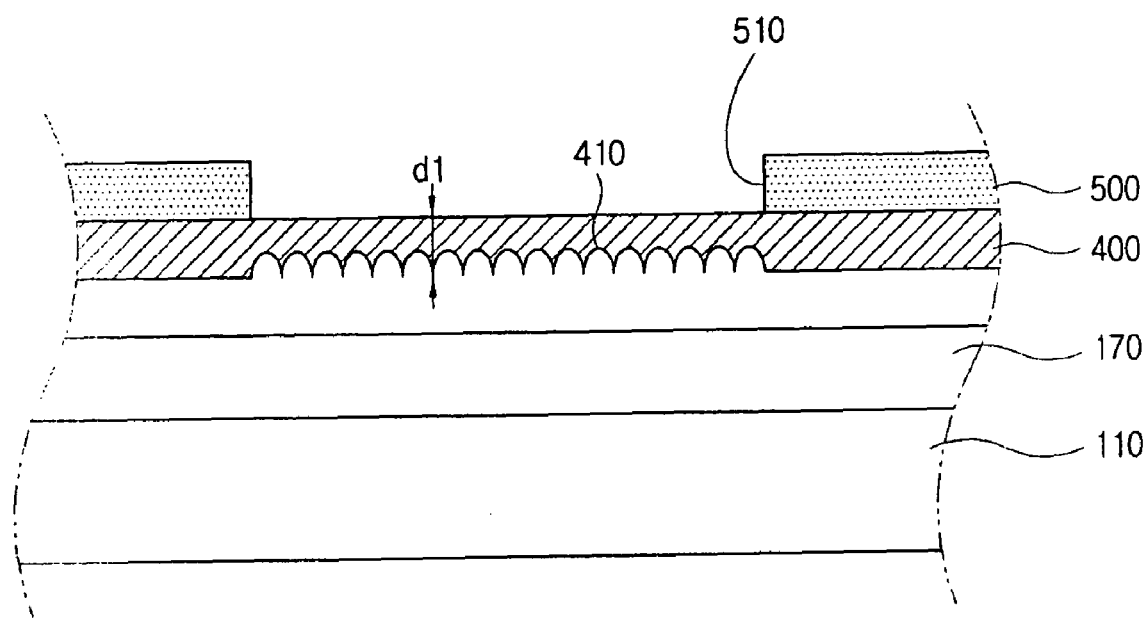
FIGS. 5A through 5D are cross-sectional views illustrating a manufacturing process of another exemplary embodiment of a TFT substrate according to the present invention.

Referring to 5a, an organic passivation layer 170 is formed on a first insulating substrate 110. Here, the organic passivation layer 170 is formed of a low cohesive organic layer, different from the first described exemplary embodiment, and hardened by ultraviolet rays or heat. Referring to FIG. 5A, a mold 400 and a mask 500 are unified, in which the mask 500 is disposed on the mold 400. On the mold 400 are formed an intaglio pattern 410 corresponding to a pixel area and a projection (not shown) corresponding to a drain electrode 163. Further, the mask 500 disposed on the mold 400 has a hole 510 corresponding to the pixel area.

Figure 5B:
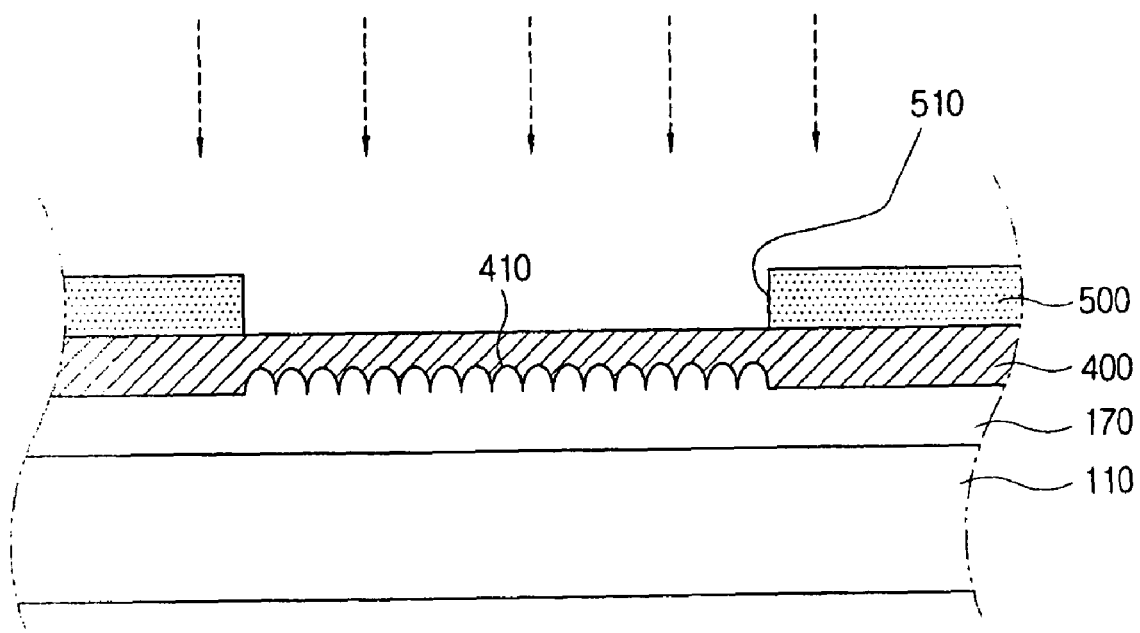

Referring to FIG. 5B, when the mold 400 and the mask 500, which are unified, are pressurized in the direction of the organic passivation layer 170, an embossing pattern 175 is formed on the surface of the organic passivation layer 170 and a drain contact hole (not shown) is formed. The embossing pattern 175 is formed by the intaglio pattern 410 of the mold 400 and the drain contact hole (not shown) formed connects the pixel electrode (not shown) and the drain electrode (not shown) by the projection. However, since the organic passivation layer 170 does not maintain its shape, if the mold 400 is removed, the organic passivation layer 170 is hardened by irradiation with ultraviolet rays due to a low cohesive organic layer.

Here, since the mold 400 is formed of a transparent material transmitting ultraviolet rays, the embossing pattern 175 is hardened and exposed while being maintained in its shape. The transparent material used for the mold 400 may be PDMS (polydimethylsilixane). Preferably, a distance d1 (FIG. 5A) between the lower side of the mask 500 contacting the mold 400 and the top of the intaglio pattern 410 is in the range of about 0.1 mm to about 0.7 mm. When the distance d1 is less than about 0.1 mm, it is hard to make a desirable shape of the embossing pattern 175. Therefore, yield and reflectance of the embossing pattern 175 is not good. On the other hand, when the distance d1 is more than about 0.7 mm, the mold 400 becomes thick and light is largely refracted while transmitting ultraviolet rays. Therefore, when a desirable shape of the embossing pattern 175 is not formed, yield and reflectance of the embossing pattern 175 is lowered.

Figure 5C:
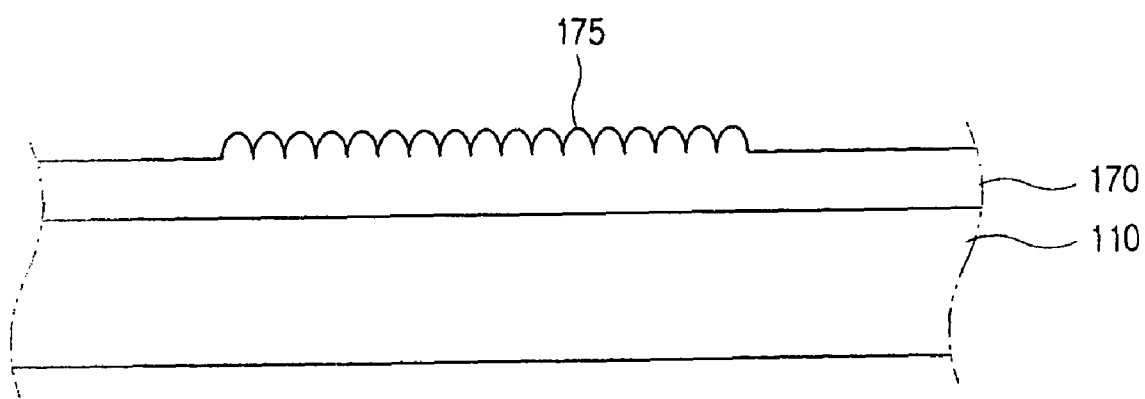
Figure 5D:
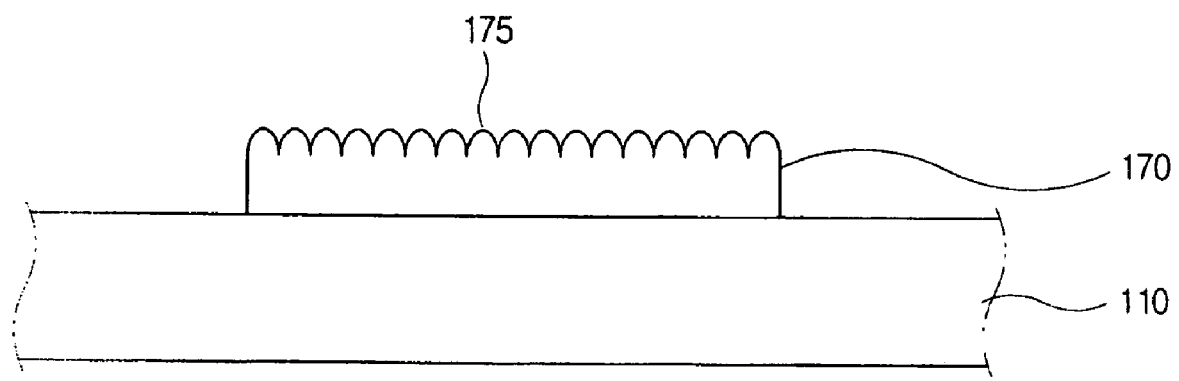

Referring to FIG. 5C, the mold 400 and the mask 500, which are unified, are removed. Subsequently, referring to FIG. 5D, the organic passivation layer 170 is developed, then the embossing pattern 175 is exposed to ultraviolet rays and the rest of the organic passivation layer 170 is removed. Preferably, a release agent is applied on the surface where the embossing pattern 175 is formed so as to separate the organic passivation layer 170 from the mold 400.

In the aforementioned embodiment, the organic passivation layer 170 having the embossing pattern 175 is formed of a photoresist organic material of which area exposed to ultraviolet rays is removed. However, the organic passivation layer 170 having the embossing pattern 175 may be formed of a photoresist organic material of which area not exposed to ultraviolet rays is removed. In this case, a hole 510 is disposed on an area of the mask 500 corresponding to the organic passivation layer 170 that is not removed.

In this second described exemplary embodiment, the superior embossing pattern 175 is formed of a low cohesive organic material when the mold 400 is pressurized. Also, the embossing pattern 175 is hardened while being maintained in its shape by the mold 400, thereby enhancing yield and reflectance of the embossing pattern 175. Further, the embossing pattern 175 is formed by the mold 400, thereby simplifying the manufacturing process as compared with a conventional process using a slit mask.

Thus, the present invention provides a manufacturing method of a liquid crystal display which improves yield and reflectance of embossing patterns in a simple process.

It will be apparent to those skilled in the art that various modifications and variation can be made in the present invention without departing from the spirit or scope of the invention. Thus it is intended that the present invention cover the modifications and variations of this invention provided they come within the scope of the appended claims and their equivalents.

What is claimed is:

1. A manufacturing method of an LCD comprising:
   forming an insulating substrate;
   forming a gate line extending in a horizontal direction and a data line insulatively crossing the gate line to form a pixel area at an intersection of the gate line and the data line;
   forming a thin film transistor (TFT) disposed in the pixel area;
   forming an organic passivation layer on the TFT;
   forming a drain contact hole exposing the drain electrode and forming an embossing pattern, which includes a plurality of protrusions, in the organic passivation layer by disposing and pressurizing a mold having an intaglio pattern corresponding to the pixel area and a projection corresponding to the drain electrode on the organic passivation layer;
   removing the mold;
   exposing the organic passivation layer to light through a mask and developing the organic passivation layer to remove the organic passivation layer where the embossing pattern is not formed;
   forming a pixel electrode connected to the drain electrode through the drain contact hole; and
   forming a reflective layer on at least one area of the pixel electrode, the reflective layer having an irregular pattern on opposing major surfaces defining the reflective layer,
   wherein the mask has a hole corresponding to at least two of the protrusions of the embossing pattern.

2. The method of claim 1, wherein an end portion of the projection contacts the drain electrode when the mold is pressurized.

3. The method of claim 1, wherein the organic passivation layer is formed of a high cohesive organic material, and
   wherein the organic passivation layer maintains the embossing pattern after removing of the mold and before exposing of the organic passivation layer to light through the mask and developing of the organic passivation layer.

4. The method of claim 1, wherein a release agent is applied on the surface of the mold where the intaglio pattern is formed.

* * * * *